United States Patent
Xu et al.

(10) Patent No.: US 11,073,886 B2
(45) Date of Patent: Jul. 27, 2021

(54) BALANCE INPUT CURRENT OF POWER SUPPLIES

(71) Applicant: Facebook, Inc., Menlo Park, CA (US)

(72) Inventors: Mingchun Xu, Danville, CA (US); Michael Timothy Kauffman, Campbell, CA (US)

(73) Assignee: Facebook, Inc., Menlo Park, CA (US)

( * ) Notice: Subject to any disclaimer, the term of this patent is extended or adjusted under 35 U.S.C. 154(b) by 246 days.

(21) Appl. No.: 16/158,116

(22) Filed: Oct. 11, 2018

(65) Prior Publication Data

US 2020/0117263 A1    Apr. 16, 2020

(51) Int. Cl.
*G06F 1/3212* (2019.01)
*H02M 7/02* (2006.01)
*H02J 7/00* (2006.01)
*G01R 15/14* (2006.01)

(52) U.S. Cl.
CPC ......... *G06F 1/3212* (2013.01); *G01R 15/144* (2013.01); *H02J 7/0014* (2013.01); *H02M 7/02* (2013.01)

(58) Field of Classification Search
CPC .... G01R 15/144; G06F 1/3212; H02J 7/0014; H02J 3/26; H02M 2001/0003; H02M 7/02; H02M 7/04; H02M 7/2173; H02M 7/217; H02M 7/76; H02M 7/219

USPC ............... 363/87, 92, 129, 127, 89
See application file for complete search history.

(56) References Cited

U.S. PATENT DOCUMENTS

| | | | | |
|---|---|---|---|---|
| 6,320,771 B1 * | 11/2001 | Hemena | ................. | H02J 1/102 323/272 |
| 2006/0022650 A1 * | 2/2006 | Vinciarelli | ........ | H02M 3/33523 323/266 |
| 2006/0171178 A1 * | 8/2006 | Shvarts | ..................... | H02J 1/10 363/65 |
| 2011/0080115 A1 * | 4/2011 | Ge | ....................... | H05B 45/395 315/294 |
| 2017/0093205 A1 * | 3/2017 | Banno | ..................... | H02M 3/00 |
| 2017/0180006 A1 * | 6/2017 | de Hoog | .................. | H02J 1/14 |

* cited by examiner

*Primary Examiner* — Emily P Pham
(74) *Attorney, Agent, or Firm* — Van Pelt, Yi & James LLP

(57) ABSTRACT

In an embodiment, a system for balancing input current for power supplies a voltage detector configured to detect an input voltage to a power supply of a plurality of different power supplies. The system further includes one or more circuit elements configured to adjust one or more properties of the one or more circuit elements based at least in part on the detected input voltage in an attempt to maintain a consistent current input across the plurality of different power supplies.

13 Claims, 7 Drawing Sheets

BALANCE INPUT CURRENT OF POWER SUPPLIES

BACKGROUND OF THE INVENTION

Data centers are growing rapidly as a result of the growth of the cloud computing. Data centers consume a great deal of electricity. Improving operational efficiency and stability such as reducing electricity consumption and improving the way electricity is delivered to data centers would improve the functioning of data center devices and performance of data centers. Power is typically distributed to commercial entities such as data centers with three-phase AC voltages. Various factors can cause the three phases to become unbalanced, meaning that the voltages of each phase are unequal. Imbalances in electric distribution can affect power quality, damage electrical equipment, and trip protective devices. Thus, there is a need to minimize imbalances in AC voltage phases.

BRIEF DESCRIPTION OF THE DRAWINGS

Various embodiments of the invention are disclosed in the following detailed description and the accompanying drawings.

DETAILED DESCRIPTION

Figure 1:
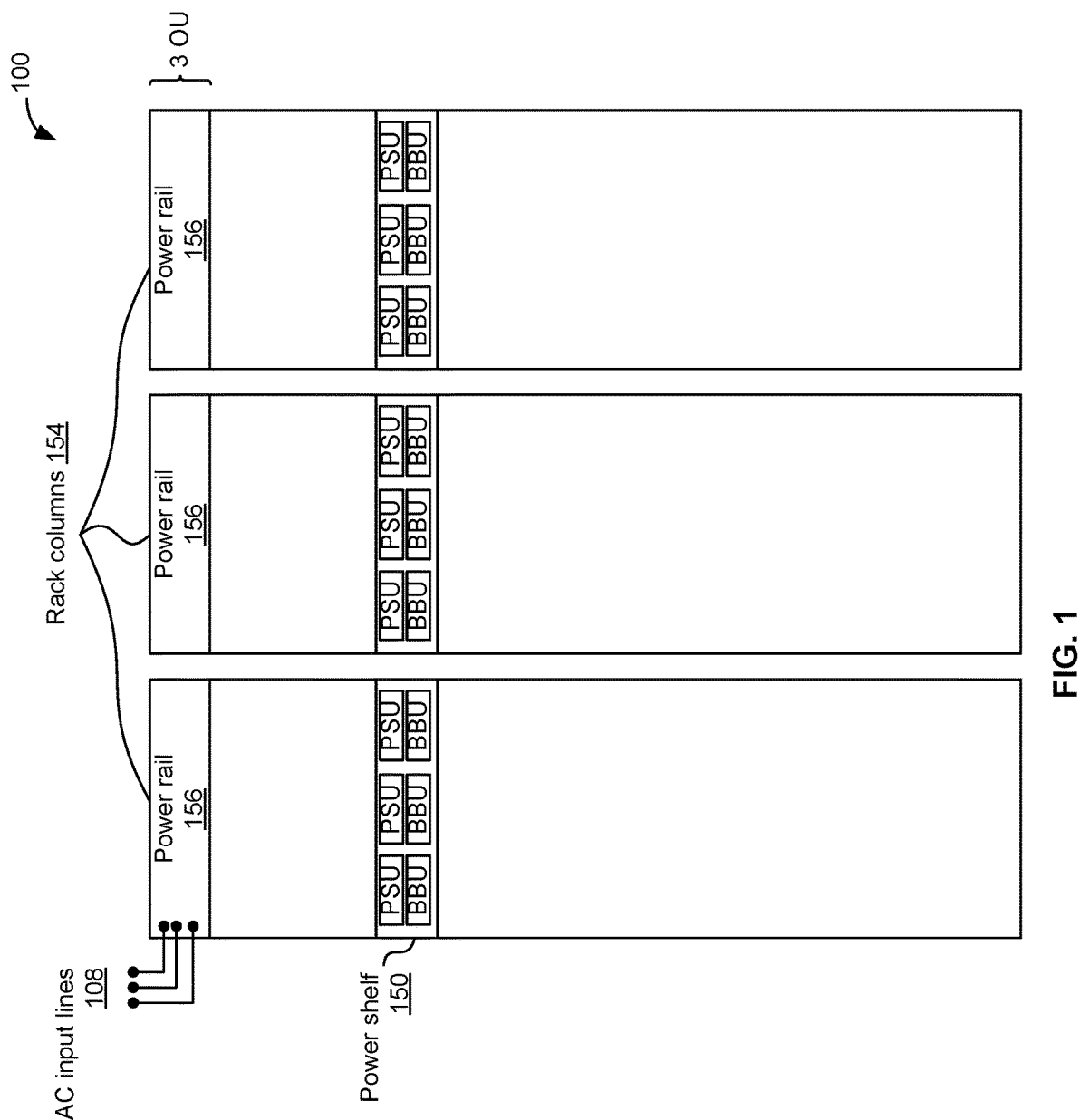
FIG. 1 is a block diagram illustrating an embodiment of a server rack in which a current balancing system is provided.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

When power components (converters, supplies, transistors, rectifiers, and the like) are operated in parallel, they do not inherently share the load. For example, without a current-share control, one or more power converters will assume a disproportionate fraction of the load. One converter may deliver current up to its current limit setting, which is beyond its rated maximum. This may cause damage to the converters. Converters that operate at higher temperatures will age prematurely. One typical technique for load sharing is sharing output current within the parallel converters using droop or active current sharing. The output power is shared among the converters. If conversion efficiency differences are disregarded, this also controls the input power to be shared evenly among the converters.

However, this power-balanced control has been observed in data centers to contribute to increased voltage imbalances across different phases of electric power. The effort to maintain consistent power level across different parallel converters drives input AC voltages provided to the converters to become increasingly unbalanced. This is because asymmetrical impedance and coupling in a three-phase power cable and busbar distribution causes unbalanced phase voltages at the load side. Because power is the product of voltage and current, in order to keep the same power among the converters connected in the three-phase system, the converter with lower input voltage will have higher current. Lower current leads to a smaller voltage drop across the distribution cable and bus bar, then leading to even higher voltage at the input of the converter. Conversely, higher current leads to a larger voltage gain across the distribution cable and bus bar, then leading to even lower voltage at the input of the converter. Voltage imbalances can grow with loading increased due to the positive feedback loop of drawing growing amounts of current as further described with respect to FIGS. 3A and 3B. Thus, while load may be shared equally using conventional power balancing techniques, AC voltage imbalances may result and worsen with loading increased. Imbalances in AC phases may reduce power quality, and may even trip protective devices or damage electrical equipment.

Techniques disclosed here allow a load to be shared between converters while minimizing AC voltage imbalances. In various embodiments, input current to power converters (sometimes called "power supplies") are balanced (e.g., as opposed to maintaining consistent power across converters) in an effort to minimize contribution of the converters to electrical power voltage imbalances across its different phases. For example, consistent input current is maintained in response to detected input voltage to a power supply system. In various embodiments, a system for balancing input current of power supplies includes a voltage detector configured to detect an input voltage to a power supply system and the detected input voltage is utilized to maintain consistent input current. The system also includes one or more circuit elements configured to adjust one or more properties of the circuit element(s) based on, among other things, the detected input voltage. The properties are adjusted in an attempt to maintain a consistent input current across a plurality of different power supply units. Maintaining a consistent current minimizes the input voltage differences applied to power supply units. One or more of the techniques described here find application in a variety of systems including server racks of data centers. FIG. 1 shows an example of a server rack in which the disclosed power distribution system can be provided. The disclosed techniques improve system performance by enhancing three phase power system stability.

FIG. 1 is a block diagram illustrating an example of a server rack in which a current balancing system can be provided. The server rack shown here is merely exemplary and not intended to limit the use cases for the techniques described here. For example, the input current can be balanced for other types of electrical equipment such as, without limitation, server racks with different configurations or components or windfarms, hydroelectric plants, and the like.

A server rack 100 may be a single column rack, may include three rack columns 154 (or three single column racks), or may include multiple columns. A power rail 156 in the server rack 100 can enclose power lines, breakers, receptacle plugs, three-phase plugs (e.g., P1, P2, and P3) for AC voltage input lines 108, or any combination thereof. The three-phase AC voltages input via lines 108 are separated from each other by 120 degrees. AC voltage input is delivered over three hot wires and an optional fourth neutral wire. Each single column rack can have a rack width (e.g., 600 mm) in accordance with the Open Rack-Open Compute Project standard, which can host server chassis up to 537 mm in width.

In this example, the power shelf 150 comprises three power supply units (PSUs). Each of the PSUs draws power from three phase AC voltage input lines 108 (e.g., P1, P2, or P3, and Neutral) from the power grid. That is, each PSU in each pair can receive one of the three AC phases from the AC power source. An example of a PSU is shown in FIGS. 2A and 2B.

Figure 2A:
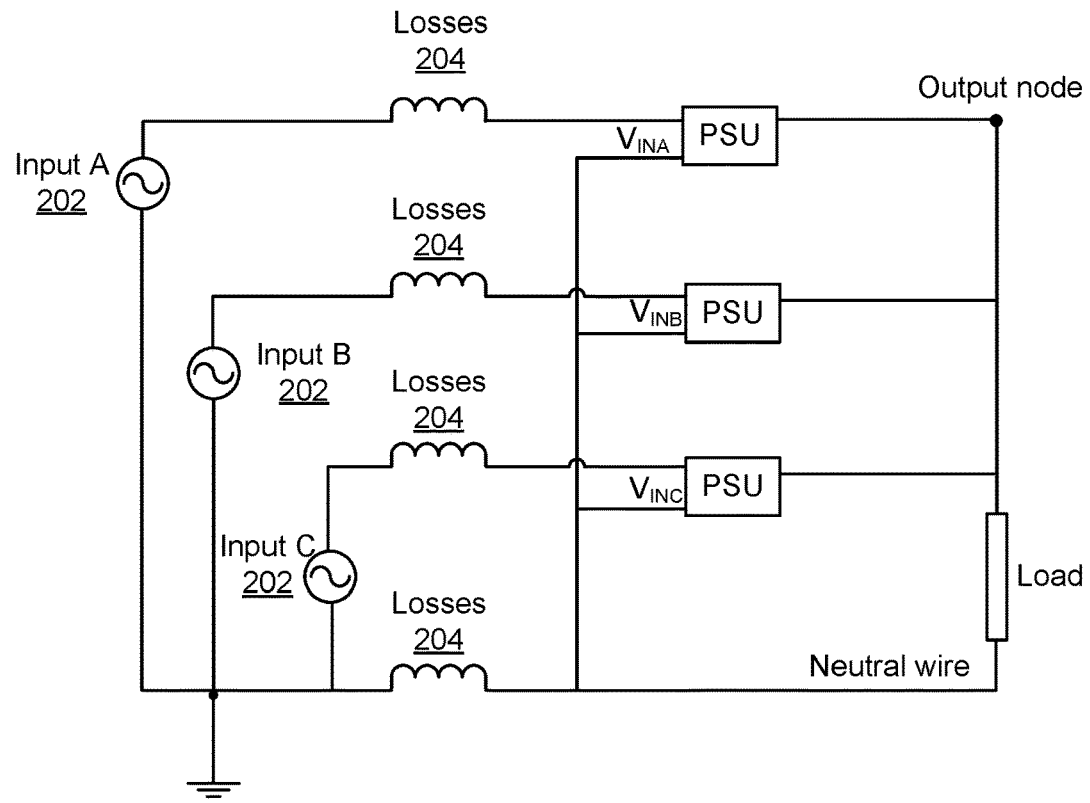
FIG. 2A is a block diagram illustrating an embodiment of a system in a Wye configuration for distributing power to data center components.
Figure 2B:
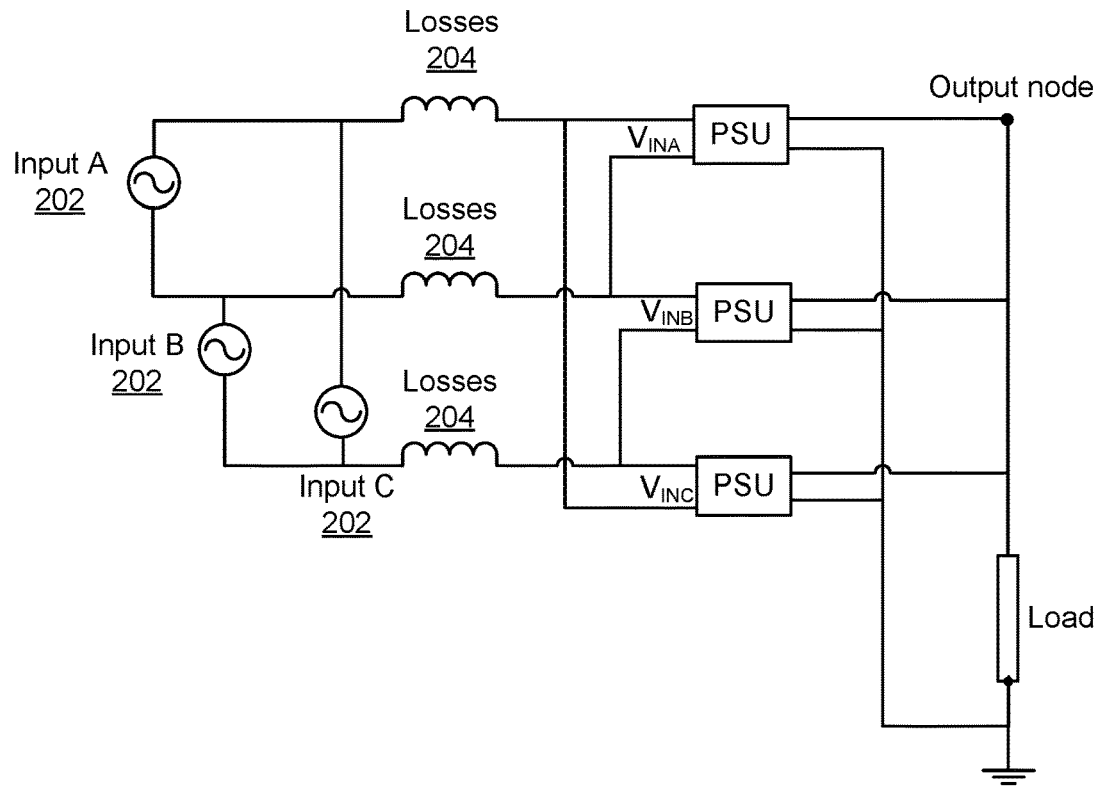
FIG. 2B is a block diagram illustrating an embodiment of a system in a Delta configuration for distributing power to data center components.

FIG. 2A is a block diagram illustrating an embodiment of a system in Wye configuration for distributing power to data center components. FIG. 2B is a block diagram illustrating an embodiment of a system in Delta configuration for distributing power to data center components. Each of the systems includes AC inputs 202, three PSUs, and a load.

Each phase of a three-phase AC input from the grid is delivered to the PSUs (Input A is one phase, Input B is one phase, and Input C is one phase). The three-phase AC voltages are separated from each other by 120 degrees. The three phases are delivered over either three hot wires (Delta connection in FIG. 2B) or with a neutral wire (Wye connection in FIG. 2A). Here, three PSUs can be connected from each phase to neutral (Wye connection) or between phases (Delta connection). The three PSUs are tied to the same output node and power is delivered to the load. The load may include one or more electronic devices, but for simplicity here is simply show as a single block. The phase distribution (here, a single phase to each PSU) is merely exemplary and not intended to be limiting. For example, in other embodiments, more than one phase can be distributed to a PSU and the distribution of phases is not necessarily even.

In a conventional system, input power is balanced as a result of balancing an output load (current sharing) and balancing output power. Each PSU in each pair receives one of the three AC phases from the AC power source. The power balancing is intended to cause the load to be the same at any instant for an equal balance of the input AC three phases. However, in most conventional systems, equal balance of input AC phase voltage is not typically achieved.

Figure 3A:
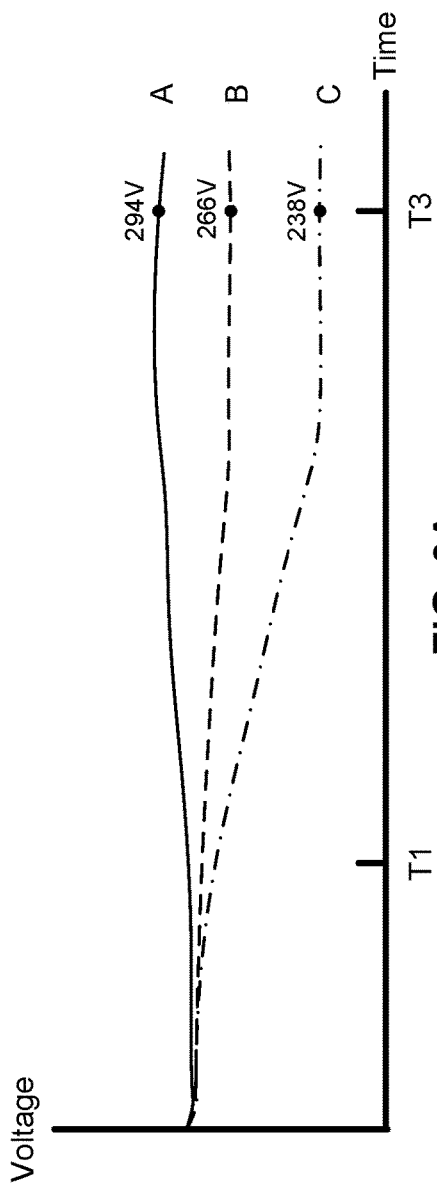
FIG. 3A illustrates an example of an output voltage of a conventional power balancing system.
Figure 3B:
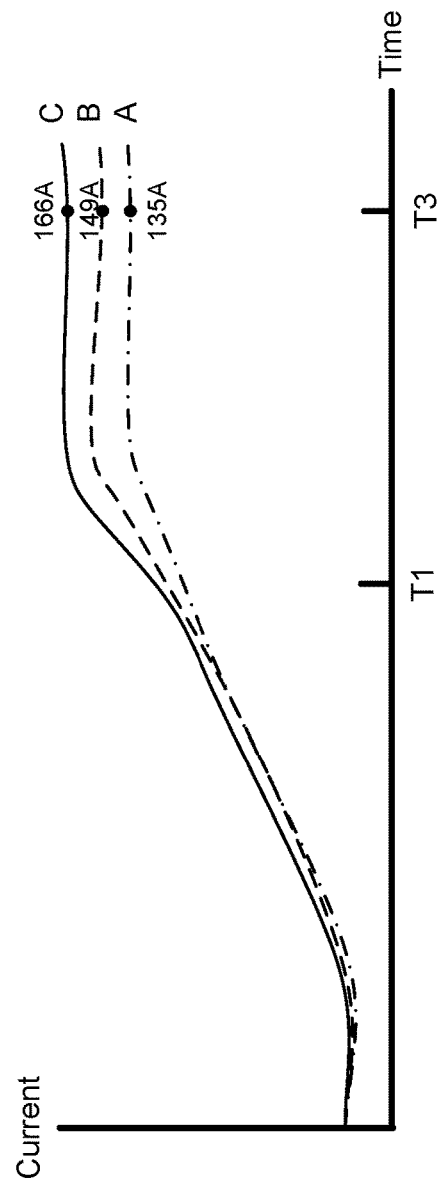
FIG. 3B illustrates an example of output current corresponding to FIG. 3A.

This is because the impedance of power transmission lines (represented as Losses 204) among three phases and neutral line are not exactly the same, and the coupling impedance among them are even more unequal. Unequal impedance causes different voltage drop and phase shift, and leads the different phase voltage at PSUs input side as well. Attempting to maintain consistent power tends to cause currents drawn by one power converter to vary, causing voltages of the AC input (due to attempting to maintain power) to change. For example, if current decreases, voltage increases. The system tends to behave like a positive feedback loop where, in order to maintain consistent power given the changing voltage, the current drawn changes. For example, if voltage increases, current will decrease to maintain the required consistent power in conventional systems. Output voltages and currents tend to diverge from each other as load increases, leading to an imbalance. FIGS. 3A and 3B show example output voltages and currents in a conventional power balancing system. As voltages fluctuate over each converter, the differences between the voltages of the converters grow. Thus, voltages of the converters become imbalanced.

FIG. 3A illustrates an example of input voltage of a conventional power balancing system. The shown voltage is measured at Input A, Input B, and Input C of FIGS. 2A and 2B. As shown in FIG. 3A, while the voltages of the three phases all start out at approximately the same value, they begin to diverge at time T1, and the divergence grows with increasing load. This is due to the reasons described above, e.g., a power grid impedance imbalance causes voltages to become imbalanced. In a conventional power distribution system, consistent power is maintained among units. Due to the inverse relationships between voltage and current, more current is drawn and voltage drops causing a divergence between voltages of converters that grows as load increases. Each converter tries to maintain consistent power, but this cause voltage balances to become worse. This in turn worsens the voltage imbalance in a positive feedback loop, so that by time T3, the differences in voltages becomes even more pronounced as shown in FIG. 3A. For example, at time T3, the value of A is 294V, the value of B is 266V, and the value of C is 238V. This means the voltage imbalance, given by the highest voltage value minus the lowest voltage value is 55V. This imbalance may reduce power quality, damage or cause malfunction in equipment, and trip protective devices. FIG. 3B illustrates an example of current corresponding to FIG. 3A. Like voltage, current also diverges when load increases.

Thus, there is a need to reduce voltage differences between three phases while keeping the power differences between three units in an acceptable range. One or more of the techniques described here mitigate voltage imbalances from becoming greater. Unlike conventional systems that balance output power, which may cause voltage and current imbalances, one or more of the techniques described here balance input current, which mitigates voltage imbalances. One or more of the techniques described here relax power balancing, and does not require power to be balanced. An effect of the balanced input currents achieved by systems and methods described here causes power to be balanced.

One or more of the techniques described here improve power distribution to a load such as the one shown FIGS. 2A and 2B.

Figure 5:
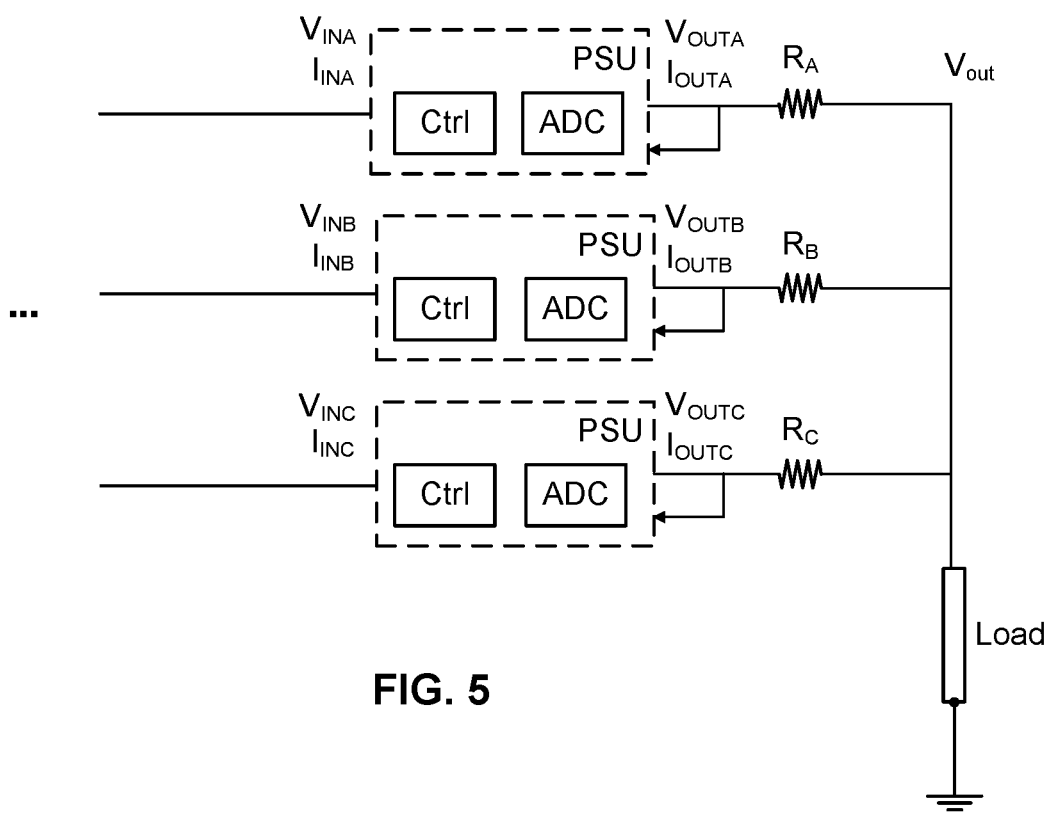
FIG. 5 is a block diagram illustrating an embodiment of a power distribution system in which input current is balanced.

FIG. 5 is a block diagram illustrating an embodiment of a power distribution system with droop current sharing. In conventional droop sharing control, the droop coefficient $R_A$, $R_B$ and $R_C$ are designed to be with same value, the output voltage of the three PSUs are also designed to be same. Thus, when three PSUs are connected in parallel as in FIG. 5, they will share output current evenly, meaning that $I_{OUTA}$, $I_{OUTB}$, and $I_{OUTC}$. Correspondingly, $V_{OUTA}$, $V_{OUTB}$, and $V_{OUTC}$ are also same. Therefore, the power between the three PSUs are consistent.

However, if the system has imbalanced impedance, this will cause imbalanced input voltage and input current. Two examples of how to obtain the same input current to minimize the input voltage difference will now be described.

Figure 4:
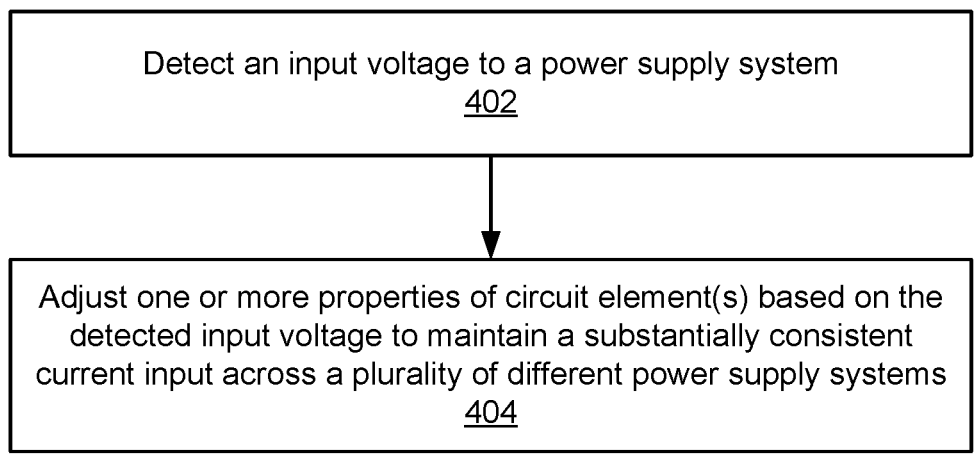
FIG. 4 is flow chart illustrating an embodiment of a process for balancing input current.

FIG. 4 is flow chart illustrating an embodiment of a process for balancing input current. The process can be implemented by a controller of a PSU such as the controllers shown in FIGS. 4, 5, and 6. Unlike a conventional power balancing process, a consistent power is not required. Instead, input current to several parallel power converters is balanced so that the input currents to the converters are substantially equal or within a threshold range of each other. This minimizes the input voltage imbalance.

An input voltage to a power supply system is detected (402). Input voltages may correspond to one or more phases of input AC voltage. Referring to FIG. 5, each of three phases of AC input is provided to the PSUs. $V_{INA}$ is input voltage to the first PSU, $V_{INB}$ is input voltage to the first second PSU, and $V_{INC}$ is input voltage to the third PSU. Typically (in a non-ideal case), the input voltages vary from each other because of AC system asymmetrical impedance. The input current can be adjusted as follows to reduce input voltage imbalance.

Returning to FIG. 4, one or more properties of one or more circuit elements is adjusted based on the detected input voltage to maintain a substantially consistent current input across a plurality of different power supply systems (404). This balances input currents so that voltage imbalances are also reduced. Referring to FIG. 5, input currents $I_{INA}$, $I_{INB}$, and $I_{INC}$ are balances so that they are substantially equal to each other. The resulting voltages and currents are improved because they vary less from each other compared with conventional systems, as further described with respect to FIGS. 7A and 7B.

The one or more properties of circuit element(s) adjusted depends on the type of circuit in which this process is applied. For example, one or more circuit element(s) are adjusted to dynamically change a resistance, impedance, load, output current, relationship/ratio value between an electrical value of a shared bus of converters and output current (e.g., slope value relating a bus voltage to output current), scaling value/factor of an electrical value of a shared bus of converters, and the like. Examples of the circuit element(s) include adjustable resistors, capacitors, inductors, amplifiers, transistors, switches, analog circuit controllers, digital circuit controllers, etc. In a droop sharing circuit example such as the one shown in FIG. 5, a droop coefficient ($R_A$, $R_B$, $R_C$) is adjusted to maintain consistent current between the three inputs. In an active sharing circuit example such as the one shown in FIG. 6, a slope/relationship or scaling factor is adjusted to maintain consistent input current between the three inputs.

Figure 6:
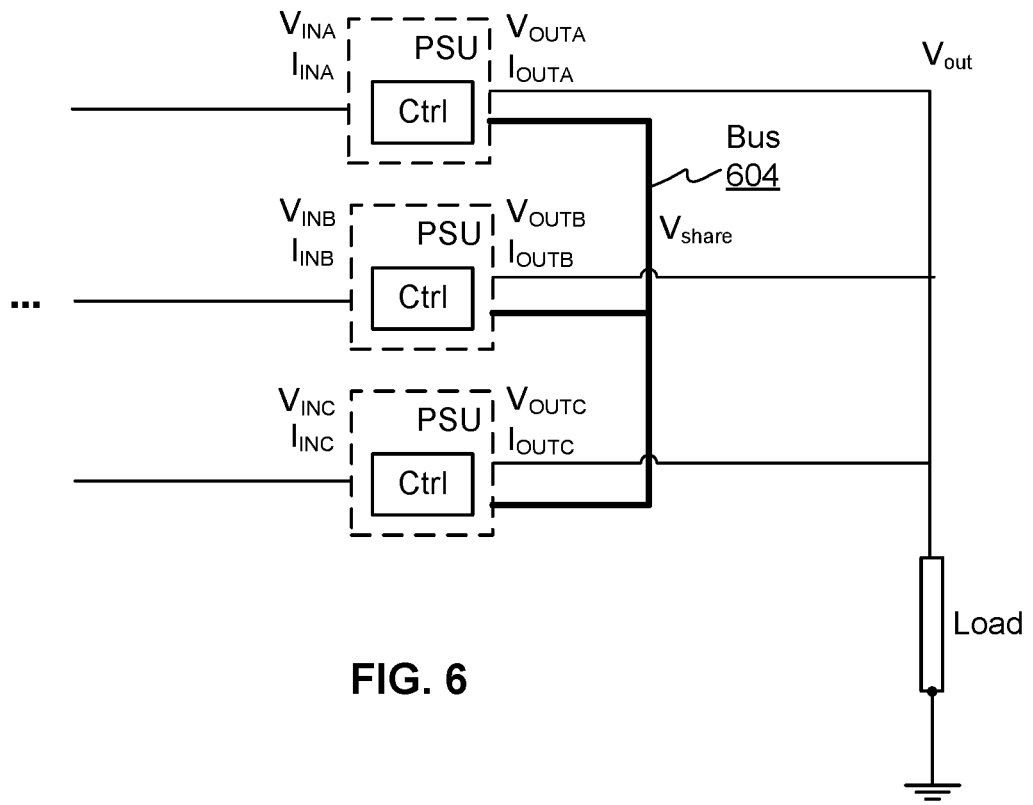
FIG. 6 is a block diagram illustrating an embodiment of a power distribution system in which current is balanced.

The process of FIG. 4 can be applied to or implemented by a variety of systems. FIGS. 5 and 6 show two examples of circuits in which input current can be balanced to balance a load on each phase of AC input.

The process of FIG. 4 can be applied to the system shown in FIG. 5 to minimize voltage imbalances by balancing input currents rather than simply balancing output power. Unlike a conventional droop sharing power balancing technique that balances output currents ($I_{OUTA}$, $I_{OUTB}$, $I_{OUTC}$), input currents ($I_{INA}$, $I_{INB}$, $I_{INC}$) are balanced by adjusting the droop coefficient ($R_A$, $R_B$, $R_C$). The droop coefficient is adjusted based on input voltage.

In the system shown in FIG. 4, assume α is PSU conversion efficiency, which is a property of the PSU. The input power and output power are related by:

$$\alpha P_{in} = P_{out} \quad (1)$$

$$\alpha V_{in} \times I_{in} = V_{out} \times I_{out} \quad (2)$$

Thus, input current at each of the PSUs is:

$$I_{in} = \frac{V_{out}}{\alpha} \times \frac{I_{out}}{V_{in}} \quad (3)$$

For the droop sharing circuit in FIG. 5, the output voltages ($V_{OUTA}$, $V_{OUTB}$, $V_{OUTC}$) are designed to be equal to each other, which means that product of output current and droop coefficient ($I_{OA}R_A$, $I_{OB}R_B$, $I_{OC}R_C$) are also equal to each other. Since $I_{in}$ is given by Equation (3), the following equations are two different input current values. Equation (4) is input current N (where N=A, B, or C using the example of FIG. 5), and Equation (5) is input current when output voltage is set to a reference value. Input current is given by Equation (5) by using a reference voltage (Vref) such as 277V (a common voltage found in commercial applications) for Vin in Equation (3).

$$I_{inN} = \frac{V_{out}}{\alpha} \times \frac{I_{outN}}{V_{inN}} \quad (4)$$

$$I_{inRef} = \frac{V_{out}}{\alpha} \times \frac{I_{outRef}}{V_{ref}} = \frac{V_{out}}{\alpha} \times \frac{I_{outRef}}{V_{ref}} \quad (5)$$

Input voltages are balanced by setting IinN=IinRef. So set Equation (4) and Equation (5) equal to each other to obtain Equation (6), wherein IoutRef is output current at the reference voltage:

$$\frac{I_{outN}}{I_{outRef}} = \frac{V_{inN}}{V_{ref}} \quad (6)$$

$$\frac{\frac{V_{outN}}{R_N}}{\frac{V_{outRef}}{R_{ref}}} = \frac{V_{inN}}{V_{ref}} \quad (R_N = R_A, R_B, R_C \ldots R_N) \quad (7)$$

Where Rref is the droop coefficient at referenced input voltage Vref.

Output voltages are equal to each other, so Equation (7) becomes:

$$\frac{Rref}{RN} = \frac{VinN}{Vref} \quad (8)$$

$$RN = \frac{Vref}{VinN} \times Rref \quad (9)$$

RN is the droop coefficient at different input voltage, where N=A, B, or C of FIG. 5 for example. For example, $R_A$ is set to (Vref*Rref)/$V_{INA}$, where Rref is the droop coefficient at the reference voltage Vref (e.g., 277V). Rref can be selected based on a variety of factors such as system requirements or reasons, which may be different from a goal of balancing input currents. A controller corresponding to the first PSU is configured to detect $V_{INA}$ and adjust $R_A$ by setting $R_A$ based on Equation (9). Similarly, a controller corresponding to the second PSU is configured to detect $V_{INB}$ and adjust $R_B$, and a controller corresponding to the third PSU is configured to detect $V_{INC}$ and adjust $R_C$. The number and placement of PSUs shown here is merely exemplary and not intended to be limiting. FIG. 6 shows another example in which input power is balanced.

FIG. 6 is a block diagram illustrating an embodiment of a power distribution system with active current sharing circuit. The number and placement of PSUs shown here is merely exemplary and not intended to be limiting.

Share BUS 604 is connected between the three PSUs. The share bus voltage from each power supply unit is proportional to its output current. In conventional control, all the units design this sharing slope (share bus voltage over output current) to be the same value. When the three units are connected together, because all the designed output parameters are same, they share the output current evenly, i.e., same output voltage, same output current, then, they get the same power both at the output and input.

The process of FIG. 4 can be applied to the system shown in FIG. 6 to minimize voltage imbalances by balancing input currents. Unlike conventional active sharing techniques that simply attempt to maintain consistent power output, input currents to the power converters can be maintained substantially consistent to reduce the contribution of the power converters to input voltage imbalances of the different phases.

In order to maintain consistent input current, the use of the signal on the shared bus (e.g., voltage on bus 604) can be modified by each individual power converter based on a detected input voltage. Thus, rather than using the same slope/relationship value (e.g., defining the relationship between shared bus voltage value and output current) across all of the power converters, the slope/relationship value can be dynamically adjusted (e.g., using an adjustment factor/value) on a per power converter level based on the detected input voltage for the corresponding power converter.

In an embodiment, the load of a PSU is shared with other PSUs, because its output current is determined by the voltage of the shared bus divided by the slope/relationship value. If changing the sharing slope, the PSU will change its output current with the same bus voltage. Thus, the slope can be dynamically adjusted based on a detected input voltage to maintain consistent input currents. For example, the various different power converters can still be connected together on the same bus, but each of PSUs can set its own sharing slope depended on a corresponding detected input voltage to obtain consistent input voltage.

Figure 7:
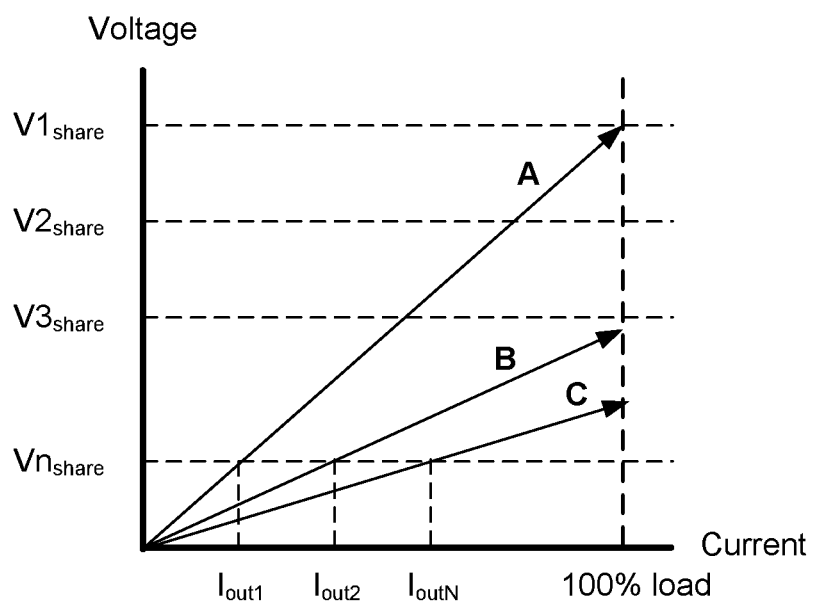
FIG. 7 shows an example of voltage of a shared bus and current output by a converter relationships in the active sharing circuit of FIG. 6.

FIG. 7 shows an example of voltage of a sharing bus and output current for the PSUs that are in the active sharing circuit of FIG. 6. In a conventional active sharing circuit, all power converters have the same slope. Here, input current is balanced for the power converters, so they do not have the same slope if the input voltage is different among each other. Instead, the slope is shown in FIG. 7 to vary for lines A (corresponding to a first converter), B (corresponding to a second converter), and C (corresponding to a third converter). On the y-axis, several shared bus voltages (Vshare) values are marked, and on the x-axis several output current values are marked. Line A shows the V-I curve of a first PSU (e.g., the top PSU in FIG. 6) at various voltages of the bus 604. Line B shows the V-I curve of the second PSU at various voltages of the bus 604. Line C shows the V-I curve of a third PSU at various voltage of the bus 604.

The current-sharing bus 604 has a given voltage (Vshare), so the output current (IoutN) for a PSU is given by:

$$IoutN = \frac{Vshare}{slopeN} \quad (10)$$

where slopeN is a relationship/mapping value between IoutN and Vshare. In some embodiments, the slope/relationship value (slopeN) is dynamically adjusted to balance input current by using an adjustment factor/value on a per power converter level based on a detected input voltage for the corresponding power converter.

In a system with balanced input currents:

$$IinN = IinRef \quad (11)$$

As described with respect to Equation (3) above, IinN and IinRef (current at a reference voltage IinRef such as 277V) are given by:

$$IinN = \frac{Vout}{\alpha} \times \frac{IoutN}{VinN} \quad (12)$$

$$IinRef = \frac{Vout}{\alpha} \times \frac{IoutRef}{Vref} \quad (13)$$

Returning to Equation (11), use Equation (12) for IinN and Equation (13) for IinRef.

$$\frac{Vout}{\alpha} \times \frac{IoutN}{VinN} = \frac{Vout}{\alpha} \times \frac{IoutRef}{Vref} \quad (14)$$

Then, use Equation (10) for IoutN and IoutRef.

$$\frac{\frac{Vshare}{slopeN}}{VinN} = \frac{\frac{Vshare}{slopeRef}}{Vref} \quad (15)$$

$$slopeRef \times Vref = slopeN \times VinN \quad (16)$$

$$slopeN = slopeRef \times \frac{Vref}{VinN} \quad (17)$$

Slope for a given power converter can be dynamically adjusted using Equation (16), where slopeN is the slope to be set, and the value of slopeN is given by the product of slope at a reference voltage (slopeRef such as slope at input voltage 277V) and the reference voltage divided by input voltage. In other words, the slope used for a converter is a reference slope changed by an adjustment factor/value, here Vref/VinN. The slope can be applied by a controller setting output current using a mapping (the mapping being a table of slopes or adjustment factors/values for example).

In some embodiments, instead of defining sharing slope, the voltage (Vrefshare) output to the sharing bus at rated load (full load) is also typically in the PSU specification (a property of the PSU). Thus, Vrefshare can be dynamically adjusted to balance input current by applying a scaling factor to a voltage of a shared bus. In some embodiments, a scaling factor is applied to the voltage of the shared bus to obtain an adjusted voltage of the shared bus. Applying the adjusted voltage causes currents to be balanced.

Since V1share/slope1=V2share/slope2= . . . =VNshare/slopeN=Vrefshare/slopeRef, then:

$$\frac{VNshare}{slopeN} = \frac{Vrefshare}{slopeRef} \qquad (18)$$

Where Vrefshare is the preset voltage on sharing bus corresponding to the referenced voltage VNshare is a scaled version of Vrefshare to use to obtain balanced input current. VNshare is given by:

$$VNshare = \frac{Vref}{VinN} \times Vrefshare \qquad (20)$$

Figure 8A:
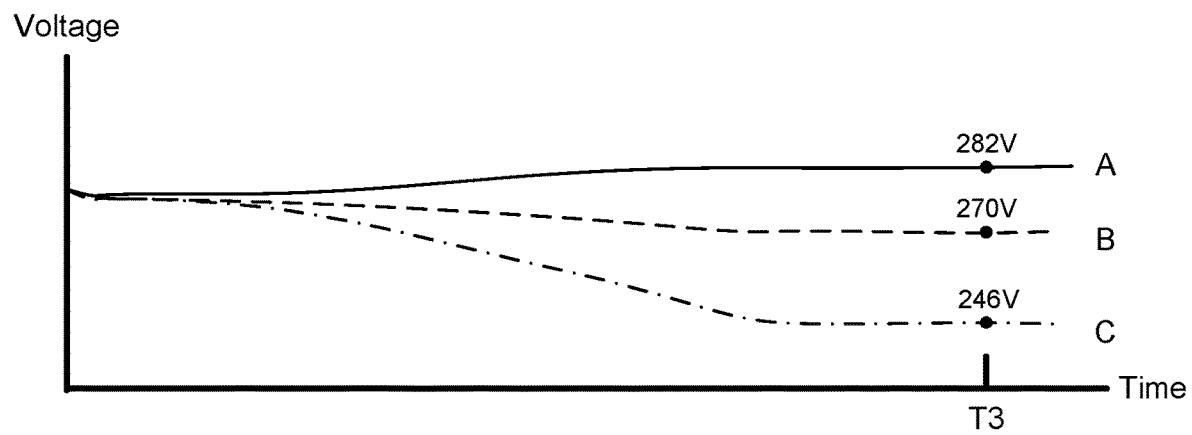
FIG. 8A illustrates an example of a voltage output obtained in some embodiments.
Figure 8B:
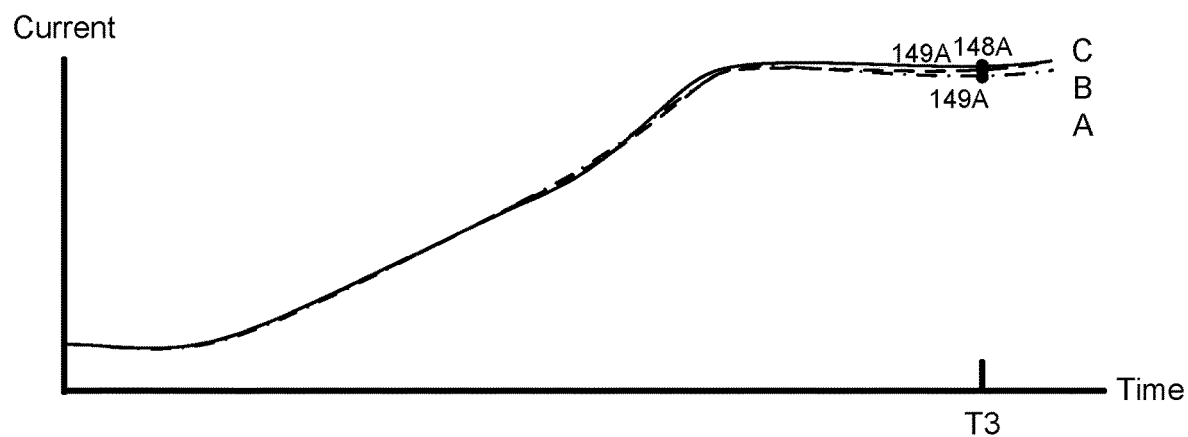
FIG. 8B illustrates an example of current output obtained in some embodiments.

The adjusted voltage, VNshare, is set by applying the scaling factor (here, reference voltage divided by input voltage) to the shared voltage at the reference voltage. Thus, the reference voltage is scaled to obtain the adjusted voltage for the shared bus. The VNshare calculated using Equation (20) is used as the Vrefshare value in Equation (10) obtain a new Iout value. A controller corresponding to the first PSU is configured to adjust a current (obtain the desired new Iout value) by using the VNshare value. For example, an analog signal is sent as feedback to the system. FIGS. 8A and 8B show simulation results by implementing the input current balancing control techniques described above.

FIG. 8A illustrates an example of input voltage obtained in some embodiments. FIG. 8B illustrates an example of input current obtained in some embodiments. The output corresponds to the system of FIG. 5 or FIG. 6. Unlike FIGS. 3A and 3B, which show the behavior of a conventional system, the behavior here shows that the PSU's contribution to voltage imbalance is minimized. For example, at time T3, the value of A is 282V, the value of B is 270V, and the value of C is 246V. This means the voltage imbalance, given by the highest voltage value minus the lowest voltage value is 36V. Compared with the imbalance in FIG. 3A, which is 55V, the imbalance here is improved (reduced). One or more of the techniques described here have been tested and resulted in a reduction in imbalance range thus representing an improvement over conventional systems. One or more of the techniques described here improve power distribution systems by balancing input current. By maintaining consistent input currents, input voltage imbalances are minimized while still obtaining relatively consistent output power so that loads are shared equally among converters. This improves power quality, prevents to damage electrical equipment, and prevents protective devices from being tripped.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system comprising:
    a voltage detector configured to detect an input voltage to a power supply of a plurality of different power supplies; and
    one or more circuit elements configured to adjust one or more properties including a droop coefficient of the one or more circuit elements based at least in part on a detected input voltage and a reference droop coefficient corresponding to a reference voltage in an attempt to maintain a consistent current input across the plurality of different power supplies.

2. The system of claim 1, wherein:
    the input voltage corresponds to a phase of a multi-phase AC input and each of the plurality of different power supplies receives a different one from the phase of the multi-phase AC input; and
    the one or more circuit elements is configured to adjust the droop coefficient in an attempt to reduce contribution of the plurality of different power supplies to voltage imbalances across phases of the multi-phase AC input.

3. The system of claim 1, wherein the droop coefficient is adjusted dynamically in response to the detected input voltage.

4. The system of claim 1, wherein the one or more properties include at least one of a resistance value or an impedance value.

5. The system of claim 1, wherein the one or more circuit elements include a controller and one or more adjusted properties include a resistance value of a resistor coupled in series with a component of the power supply.

6. The system of claim 1, wherein the one or more circuit elements include a controller and one or more adjusted properties include a resistance value of a resistor coupled in series with the power supply.

7. The system of claim 1, wherein the plurality of different power supplies provide power in parallel to a common load and the plurality of different power supplies are coupled to a common output node and one or more adjusted properties cause current inputs to the plurality of different power supplies to be within a tolerance range.

8. The system of claim 1, wherein the power supply includes an AC-to-DC converter.

9. The system of claim 1, wherein an output of the power supply is provided back to the power supply forming a feedback loop adjustable by the one or more properties.

10. The system of claim 1, wherein one or more adjusted properties include an output current of the power supply.

11. The system of claim 1, wherein the system is provided in a server rack.

12. The system of claim 1, wherein attempting to maintain the consistent current input across the plurality of different power supplies includes not attempting to maintain consistent output power across the plurality of different power supplies.

13. A computer program product embodied in a non-transitory computer readable storage medium and comprising computer instructions for:
    instructing a voltage detector to detect an input voltage to a power supply of a plurality of different power supplies;

determining one or more properties including a droop coefficient of one or more circuit elements based at least in part on a detected input voltage and a reference droop coefficient corresponding to a reference voltage in an attempt to maintain a consistent current input across the plurality of different power supplies; and instructing one or more circuit elements to adjust the one or more properties.

* * * * *